(12) United States Patent
Xie et al.

(10) Patent No.: US 9,280,070 B2
(45) Date of Patent: Mar. 8, 2016

(54) FIELD GUIDED EXPOSURE AND POST-EXPOSURE BAKE PROCESS

(71) Applicant: Applied Materials, Inc., Santa Clara, CA (US)

(72) Inventors: Peng Xie, Fremont, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/476,944

(22) Filed: Sep. 4, 2014

(65) Prior Publication Data

US 2016/0011526 A1  Jan. 14, 2016

Related U.S. Application Data

(60) Provisional application No. 62/023,097, filed on Jul. 10, 2014.

(51) Int. Cl.
*G03F 7/38* (2006.01)
*G03F 7/20* (2006.01)

(52) U.S. Cl.
CPC .......... *G03F 7/70841* (2013.01); *G03F 7/2022* (2013.01); *G03F 7/38* (2013.01)

(58) Field of Classification Search
CPC ................. G03F 7/38; G03F 7/2022
See application file for complete search history.

(56) References Cited

U.S. PATENT DOCUMENTS

| | | | |
|---|---|---|---|
| 6,686,132 B2* | 2/2004 | Cheng | G03F 7/38 430/313 |
| 2005/0074703 A1* | 4/2005 | Kim | G03F 7/7035 430/322 |
| 2005/0074706 A1* | 4/2005 | Bristol | B82Y 10/00 430/327 |

* cited by examiner

*Primary Examiner* — Evan Pert
(74) *Attorney, Agent, or Firm* — Patterson & Sheridan, LLP

(57) ABSTRACT

Methods disclosed herein apply an electric field and/or a magnetic field during photolithography processes. The field application may control the diffusion of the charged species generated by the photoacid generator along the line and spacing direction, preventing the line edge/width roughness that results from random diffusion. The field application may additionally or alternatively control the diffusion of the charged species in a direction perpendicular to a plane formed by the photoresist layer. Such controlled perpendicular diffusion may increase the photoresist sensitivity. In other embodiments, the field may control the diffusion of the charged species within the plane of the photoresist layer but in a direction perpendicular or non-parallel to the line and spacing direction. Apparatuses for carrying out the aforementioned methods are also disclosed herein.

13 Claims, 7 Drawing Sheets

FIELD GUIDED EXPOSURE AND POST-EXPOSURE BAKE PROCESS

CROSS-REFERENCE TO RELATED APPLICATIONS

This application claims benefit of the U.S. Provisional Application Ser. No. 62/023,097, filed Jul. 10, 2014, of which is incorporated by reference in its entirety.

BACKGROUND

1. Field

The present disclosure generally relates to methods and apparatuses for processing a substrate, and more specifically to methods and apparatuses for improving photolithography processes.

2. Description of the Related Art

Integrated circuits have evolved into complex devices that can include millions of components (e.g., transistors, capacitors and resistors) on a single chip. Photolithography may be used to form components on a chip. Generally the process of photolithography involves a few basic stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent may then be removed in a pre-exposure bake process.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, and, particularly, the photoresist layer may be developed and rinsed. Depending on the type of photoresist used, regions of the substrate that were exposed to electromagnetic radiation may either be resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as lower through put, increased line edge roughness, and/or decreased resist sensitivity.

Therefore, there is a need for a method and an apparatus for improving photolithography processes.

SUMMARY

Embodiments disclosed herein include an apparatus for processing a substrate. The apparatus includes a vacuum processing chamber. The vacuum processing chamber includes substrate support having a substrate supporting surface. The vacuum processing chamber also includes a heat source, the heat source configured to heat a substrate positioned on the substrate supporting surface. The vacuum processing chamber also includes an electrode assembly. The electrode assembly includes an electrode configured to generate an electric field in a direction substantially perpendicular to the substrate supporting surface. The electrode assembly is positioned opposite the substrate supporting surface. The electrode assembly is spaced apart from substrate support by a distance of at least 0.1 mm. The electrode is substantially continuous and has a flat surface facing the substrate supporting surface.

Embodiments disclosed herein include an apparatus for processing a substrate. The apparatus includes a vacuum processing chamber. The vacuum processing chamber includes substrate support having a substrate supporting surface. The vacuum processing chamber also includes a heat source, the heat source configured to heat a substrate positioned on the substrate supporting surface. The vacuum processing chamber also includes an electrode assembly. The electrode assembly includes an electrode configured to generate an electric field in a direction substantially perpendicular to the substrate supporting surface. The electrode assembly is positioned opposite the substrate supporting surface. The electrode assembly is spaced apart from substrate support by a distance of at least 0.1 mm. The electrode is substantially continuous and has a flat surface facing the substrate supporting surface. The electrode assembly is coupled to an actuator configured to scan the electrode above the substrate supporting surface. The vacuum processing chamber further includes also one or more magnets. The one or more magnets are configured to apply a magnetic field of between about 0.1 T and about 10 T to the substrate supporting surface. The vacuum processing chamber is configured to control the temperature of the electrode to match the temperature of the substrate supporting surface.

Embodiments disclosed herein further include a method of processing a substrate. The method includes applying a photoresist layer containing a photoacid generator to a substrate. The method also includes exposing portions of the photoresist layer to electromagnetic radiation to generate charged species from the photoacid generator and to form substantially parallel lines of material in the photoresist layer having different chemical properties than the portions of the photoresist layer not exposed to the electromagnetic radiation. The method further includes, after exposing the substrate, heating the substrate and reducing the pressure. The method also includes guiding the generated charged species in a direction substantially perpendicular to the substrate supporting surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1 is a schematic cross-sectional view of an apparatus for processing a substrate, according to one embodiment.

FIGS. 3A and 3B are related to each other by a 90° rotation about the z-axis shown in FIG. 1.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods and apparatuses for minimizing line edge/width roughness in lines formed in photolithography are provided. The same and/or other methods and apparatuses disclosed used herein may increase the photoresist sensitivity and/or the throughput of photolithography processes. The random diffusion of charged species generated by a photoacid generator during a post-exposure bake procedure contributes to line edge/width roughness and reduced resist sensitivity. Methods disclosed herein apply an electric field and/or a magnetic field during photolithography processes. The field application may control the diffusion of the charged species generated by the photoacid generator. A stronger field correlates to more control over the diffusion of the charged species. In some embodiments, the charged species may be guided along the line and spacing direction, preventing the line edge/width roughness that results from random diffusion. The field application may additionally or alternatively control the diffusion of the charged species in a direction perpendicular to a plane formed by the photoresist layer. Such controlled perpendicular diffusion may increase the sensitivity of the photoresist layer to exposure. In other words, the same change in resist properties may be possible by using fewer photons. In other embodiments, the field may control the diffusion of the charged species within the plane of the photoresist layer but in a direction perpendicular or non-parallel to the line and spacing direction. Apparatuses for carrying out the aforementioned methods are also disclosed herein.

Figure 1:
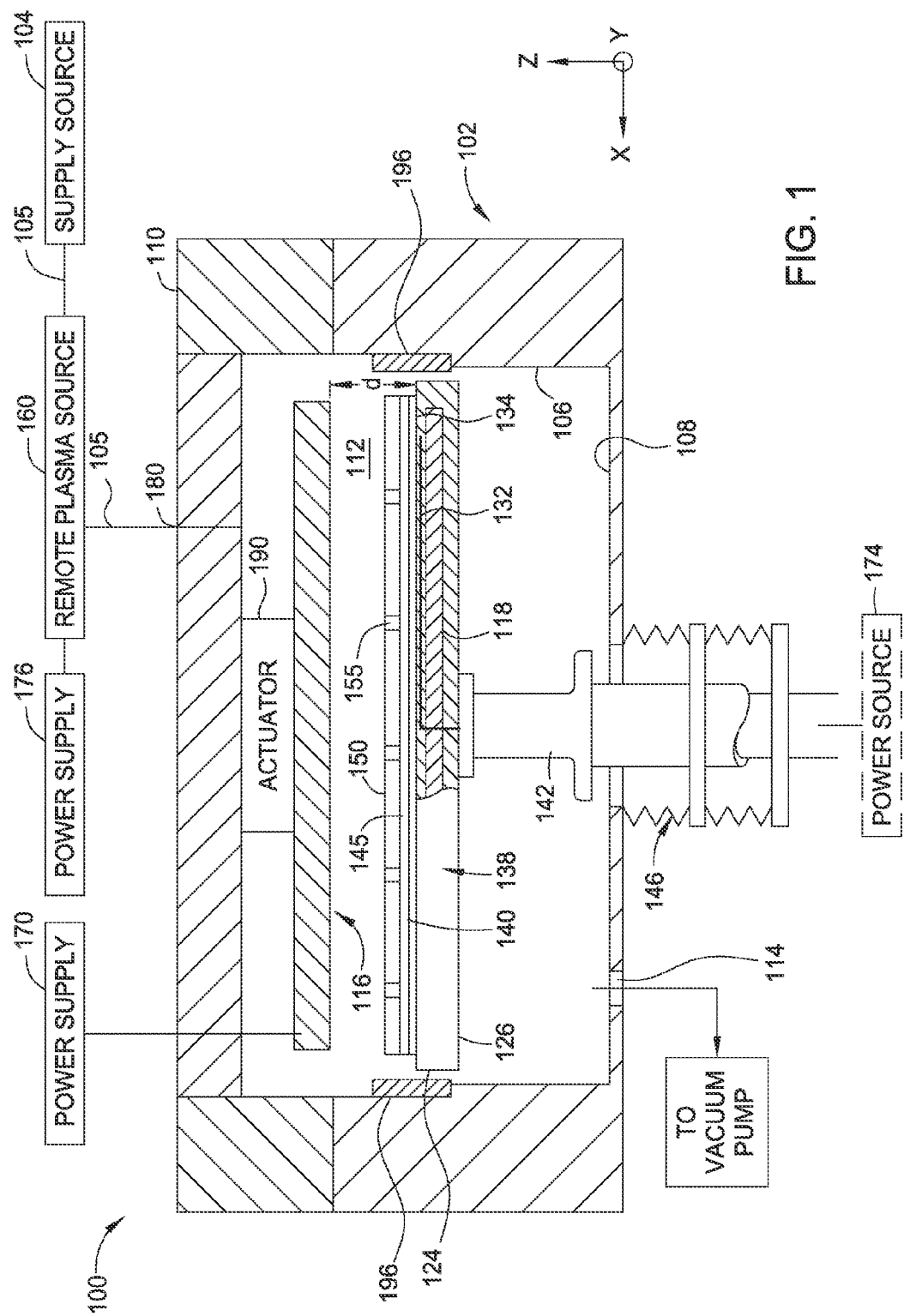

FIG. 1 is a schematic cross-sectional view of an apparatus for processing a substrate, according to one embodiment. As shown in the embodiment of FIG. 1, the apparatus may be in the form of a vacuum processing chamber 100. In other embodiments, the processing chamber 100 may not be coupled to a vacuum source. The processing chamber 100 may be an independent processing chamber. Alternatively, the processing chamber 100 may be part of a processing system, such as, for example, an in-line processing system, a cluster processing system, or the track processing system shown in FIG. 4 (discussed below).

The processing chamber 100 includes chamber walls 102, an electrode assembly 116, and a substrate support assembly 138. The chamber walls 102 include sidewalls 106, a lid assembly 110, and a bottom 108. The chamber walls 102 at least partially enclose a processing volume 112. The processing volume 112 is accessed through a substrate transfer port (not shown) configured to facilitate movement of a substrate 140 into and out of the processing chamber 100. In embodiments where the processing chamber 100 is part of a processing system, the substrate transfer port may allow for the substrate 140 to be transferred to and from a transfer chamber.

A pumping port 114 may optionally be disposed through one of the lid assembly 110, sidewalls 106 or bottom 108 of the processing chamber 100 to couple the processing volume 112 to an exhaust port. The exhaust port couples the pumping port 114 to various vacuum pumping components, such as a vacuum pump. The pumping components may reduce the pressure of the processing volume 112 and exhaust any gases and/or process by-products out of the processing chamber 100.

The substrate support assembly 138 is centrally disposed within the processing chamber 100. The substrate support assembly 138 supports the substrate 140 during processing. The substrate support assembly 138 may comprise a body 124 that encapsulates an optional electrode assembly 118 (described in FIGS. 3A-3C). The body 124 may comprise, for example, a metal, such as aluminum, or a ceramic. In embodiments where the body 124 comprises a metal, the electrode assembly 118 may be encapsulated within an insulating material (not shown) that insulates the electrode assembly 118 from the metal body 124. The electrode assembly 118 may be coupled to the power supply 174. In other embodiments, the electrode assembly 118 may be coupled to a ground. In some embodiments, the electrode assembly 118 is configured to generate an electric field parallel to the x-y plane defined by the first surface 134 of the substrate support assembly 138. For example, the electrode assembly 118 may be configured to generate an electric field in one of the y direction, x direction or other direction in the x-y plane. In other embodiments, the electrode assembly 118 is configured to generate an electric field perpendicular to the x-y plane defined by the first surface 134 of the substrate support assembly 138.

Generally, the substrate support assembly 138 has a first surface 134 and a second surface 126. The first surface 134 is opposite the second surface 126. The first surface 134 is configured to support the substrate 140. The second surface 126 has a stem 142 coupled thereto. The substrate 140 is positioned on the first surface 134 of the substrate support assembly 138. The substrate 140 may be any type of substrate, such as a dielectric substrate, a glass substrate, a semiconductor substrate, or a conductive substrate. The substrate 140 may have a layer 145 disposed thereon. The layer 145 may be any desired layer. In some embodiments, the substrate 140 may have more than one layer 145. The substrate 140 also has a photoresist layer 150 disposed over the layer 145. The substrate 140 has been previously exposed to electromagnetic radiation in an exposure stage of a photolithography process. The photoresist layer 150 has latent image lines 155 formed therein from the exposure stage. The latent image lines 155 may be substantially parallel. In other embodiments, the latent image lines 155 may not be substantially parallel.

In some embodiments, the substrate support assembly 138 may be an electrostatic chuck. In some embodiments, the body 124 of the substrate support assembly 138 may encapsulate an embedded heater 132. The embedded heater 132, such as a resistive element, is disposed in the substrate support assembly 138. The embedded heater 132 controllably heats the substrate support assembly 138 and the substrate 140 positioned thereon to a predetermined temperature. The embedded heater 132 is configured to quickly ramp the temperature of the substrate 140 and to accurately control the temperature of the substrate 140. In some embodiments, the embedded heater 132 is connected to and controlled by the power supply 174. The power supply 174 may be configured similarly to a power supply 170, discussed below.

In some embodiments, the processing chamber 100 may include other heating sources. For example, heat lamps may be positioned within or outside the processing chamber 100. In some embodiments, one or more lasers may be used to heat the photoresist layer 150 (or other layer) positioned on the substrate 140, the antennas 220, 221, 227, and/or the electrode 229 (FIGS. 2A-2C) of the electrode assembly 116. In some embodiments, the substrate support assembly 138 may be configured to circulate a high efficiency heat transfer fluid in order to more quickly increase the temperature of a substrate 140 positioned on the substrate support assembly 138.

In some embodiments, the substrate support assembly 138 may be configured to provide relative motion between the first surface 134 (and the substrate 140 positioned thereon) and the electrode assembly 116. For example, the substrate support assembly 138 may configured to rotate about the z-axis. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time. After the predetermined amount of time, the rotation may continue in a step manner or in a continuous manner.

The substrate support assembly 138 may be configured to move vertically (i.e.) in the z-direction. The substrate support assembly 138 may be separated from the electrode assembly 116. For example, the substrate support assembly 138 and the electrode assembly 116 may be separated by a distance of at least about 0.1 mm. A distance d defines the distance in the z-direction between the first surface 134 and the electrode assembly 116. The stem 142 is coupled to a lift system (not shown) for moving the substrate support assembly 138 between an elevated processing position (as shown) and a lowered substrate transfer position. The lift system may accurately and precisely control the position of the substrate 140 in the z-direction. In some embodiments, the lift system may also be configured to move the substrate 140 in the x-direction, the y-direction, or the x-direction and the y-direction. The stem 142 additionally provides a conduit for electrical and thermocouple leads between the substrate support assembly 138 and other components of the processing chamber 100. A bellows 146 is coupled to the substrate support assembly 138 to provide a vacuum seal between the processing volume 112 and the atmosphere outside the processing chamber 100 and facilitate movement of the substrate support assembly 138 in the z-direction.

The lid assembly 110 may optionally include an inlet 180 through which gases provided by the supply sources 104 may enter the processing chamber 100. The supply sources 104 may optionally controllably pressurize the processing volume 112 with a gas, such as nitrogen, argon, helium, hydrogen, neon, chlorine, other gases, or combinations thereof. The gases from the supply sources 104 may create a controlled environment within the processing chamber 100. In other embodiments, the gases from supply sources 104 may be used to generate a plasma. For example, the plasma may be generated in a remote plasma source 160. The supply sources 104 may couple directly to the processing volume 112 through a supply conduit 105. In some embodiments, such as shown, the one or more source compounds may indirectly flow into the processing volume 112. As shown, the one or more source compounds first flow through the remote plasma source 160 before flowing into the processing volume 112.

The remote plasma source 160 may be configured to provide charged species, such as electrons, into the processing volume 112. The remote plasma source may be, for example, a capacitively coupled plasma source or an inductively coupled source. The remote plasma source 160 is coupled to a power supply 176. The power supply 176 may be, for example, an RF power supply. The power supply 176 may be configured to deliver power at a frequency of 10 Hz and about 1 MHz, such as about 5 kHz. In other embodiments, the power supply 176 may be configured to deliver power at 13.56 MHz. The power supply 176 and the remote plasma source 160 may be configured to generate a "soft" plasma. For example, the generated plasma may contain charged species having an ion energy of between about 1 eV and about 1000 eV, such as between about 5 eV and about 50 eV. In some embodiments, the ion energy may be between about 1 eV and about 5 eV. Electrons in the soft plasma may be used to drive the charged species 255 (shown in FIGS. 2A and 2B) generated from the photoacid generator in the direction perpendicular to the plane of the first surface 134. Driving the charged species in the z-direction may increase resist sensitivity.

In a representative example using a 300 mm substrate, the soft plasma may be generated as follows. It is contemplated that the gas flows may be scaled proportionately to the substrate diameter. Hydrogen gas may be provided into the remote plasma source 160 at a flow rate of between about 10 sccm and about 1000 sccm. Argon may optionally be flowed into the remote plasma source 160 at a flow rate of up to about 1000 sccm. A plasma may be generated in an inductively coupled remote plasma source 160 from an RF power of between about 400 W and about 800 W. The pressure of the processing volume 112 may reduced to at least $10^{-5}$ Torr. For example, the pressure may be reduced to between about $10^{-6}$ Torr and about $10^{-5}$ Torr. The temperature of the substrate support assembly 138 may be maintained at between about 70° C. and about 160° C., such as between about 90° C. and 140° C.

An actuator 190 may be optionally coupled between the lid assembly 110 and the electrode assembly 116 to provide relative motion between the electrode assembly 116 and the substrate support assembly 138. The actuator 190 may be configured to move the electrode assembly 116 in one or more of the x, y, and z directions. The x and y directions are referred to herein as the lateral directions or dimensions. The actuator 190 enables the electrode assembly 116 to scan the surface of the substrate 140. The actuator 190 also enables the distance d to be adjusted. In some embodiments the electrode assembly 116 is coupled to the lid assembly 110 by a fixed stem (not shown). In some embodiments, the actuator 190 is configured to rotate the electrode assembly 116 about z-axis. In other embodiments, the electrode assembly 116 may be coupled to the inside of the bottom 108 of the processing chamber 100, to the second surface 126 of the substrate support assembly 138, or to the stem 142.

The electrode assembly 116 includes one or more electrodes. As shown, the electrode assembly 116 is coupled to the power supply 170. In embodiments where the electrode assembly 116 includes more than one electrode, each electrode may be connected to a power supply. In some embodiments, the electrode assembly 116 is configured to generate an electric field parallel to the x-y plane defined by the first surface 134 of the substrate support assembly 138. For example, the electrode assembly 116 may be configured to generate an electric field in one of the y direction, x direction or other direction in the x-y plane. In one embodiment, the electrode assembly 116 is configured to generate an electric field in the x-y plane and in the direction of the latent image lines 155. In another embodiment, the electrode assembly 116 is configured to generate an electric field in the x-y plane and perpendicular to the direction of the latent image lines 155. The electrode assembly 116 may additionally or alternatively be configured to generate an electric field in the z-direction, such as, for example, perpendicular to the first surface 134.

The power supply 170 and/or the power supply 174 may be configured to supply, for example, between about 500 V and about 100 kV to one or more electrodes of the electrode assembly 116 and/or the electrode assembly 118. In some embodiments, the power supply 170 and/or the power supply 174 are a pulsed direct current (DC) power supply. The pulsed DC wave may be from a half-wave rectifier or a full-wave rectifier. The power supply 170 and/or the power supply 174 may be configured to provide power at a frequency of between about 10 Hz and about 1 MHz, such as about 5 kHz. The duty cycle of the pulsed DC power may be between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, the power supply 170 and/or the power supply 174 is an alternating current power supply. In other embodiments, the power supply 170 and/or the power supply 174 is a direct current power supply.

In some embodiments, the power supply 170 and/or the power supply 174 may use a DC offset. The DC offset may be, for example, between about 0% and about 75% of the applied voltage, such as between about 5% and about 60% of the applied voltage. In some embodiments, at least one electrode of the electrode assembly 116 is pulsed negatively while at least one electrode of the electrode assembly 118 is also pulsed negatively. In such an embodiment having an electrode assembly 116 including a first electrode and a second electrode, the first electrode, the second electrode, and the at least one electrode of the electrode assembly 118 may be synchronized but offset. For example, the first electrode or the second electrode may be at the "one" state while the at least one electrode of the electrode assembly 118 is at the "zero" state," then the at least one electrode of the electrode assembly 118 is at the one state while the first electrode or the second electrode is at the zero state.

As shown, the electrode assembly 116 spans approximately the width of the substrate support assembly 138. In other embodiments, the width of the electrode assembly 116 may be less than that of the substrate support assembly 138. For example, the electrode assembly 116 may span between about 10% to about 80%, such as about 20% and about 40%, the width of the substrate support assembly 138. In embodiments where the width of the electrode assembly 116 is shorter than the width of the substrate support assembly 138, the actuator 190 may scan the electrode assembly 116 across the surface of the substrate 140 positioned on the first surface 134 of the substrate support assembly 138. For example, the actuator 190 may scan such that the electrode assembly 116 scans the entire surface of the substrate 140. In other embodiments, the actuator 190 may scan only certain portions of the substrate 140. Alternatively, the substrate support assembly 138 may scan underneath the electrode assembly 116.

In some embodiments, one or more magnets 196 may be positioned in the processing chamber 100. In the embodiment shown in FIG. 1, the magnets 196 are coupled to the inside surface of the sidewalls 106. In other embodiments, the magnets 196 may be positioned in other locations within the processing chamber 100 or outside the processing chamber 100. For example, the magnets 196 may be positioned within the processing chamber 100 and adjacent to the bottom 108 and/or the lid assembly 110. The magnets 196 may be, for example, permanent magnets or electromagnets. Representative permanent magnets include ceramic magnets and rare earth magnets. In embodiments where the magnets 196 include electromagnets, the magnets 196 may be coupled to a power supply (not shown). The magnets 196 are configured to generate a magnetic field in a parallel direction, a perpendicular direction, or other direction relative to the electric field generated by electrode assembly 116 and/or the electrode assembly 118. The magnets 196 may be configured to generate a field strength across the first surface 134 of between about 0.1 Tesla (T) and about 10 T, such as between about 1 T and about 5 T. In embodiments including a magnetic field, the magnets 196 may remain stationary or move relative to the first surface 134.

Figure 2A:
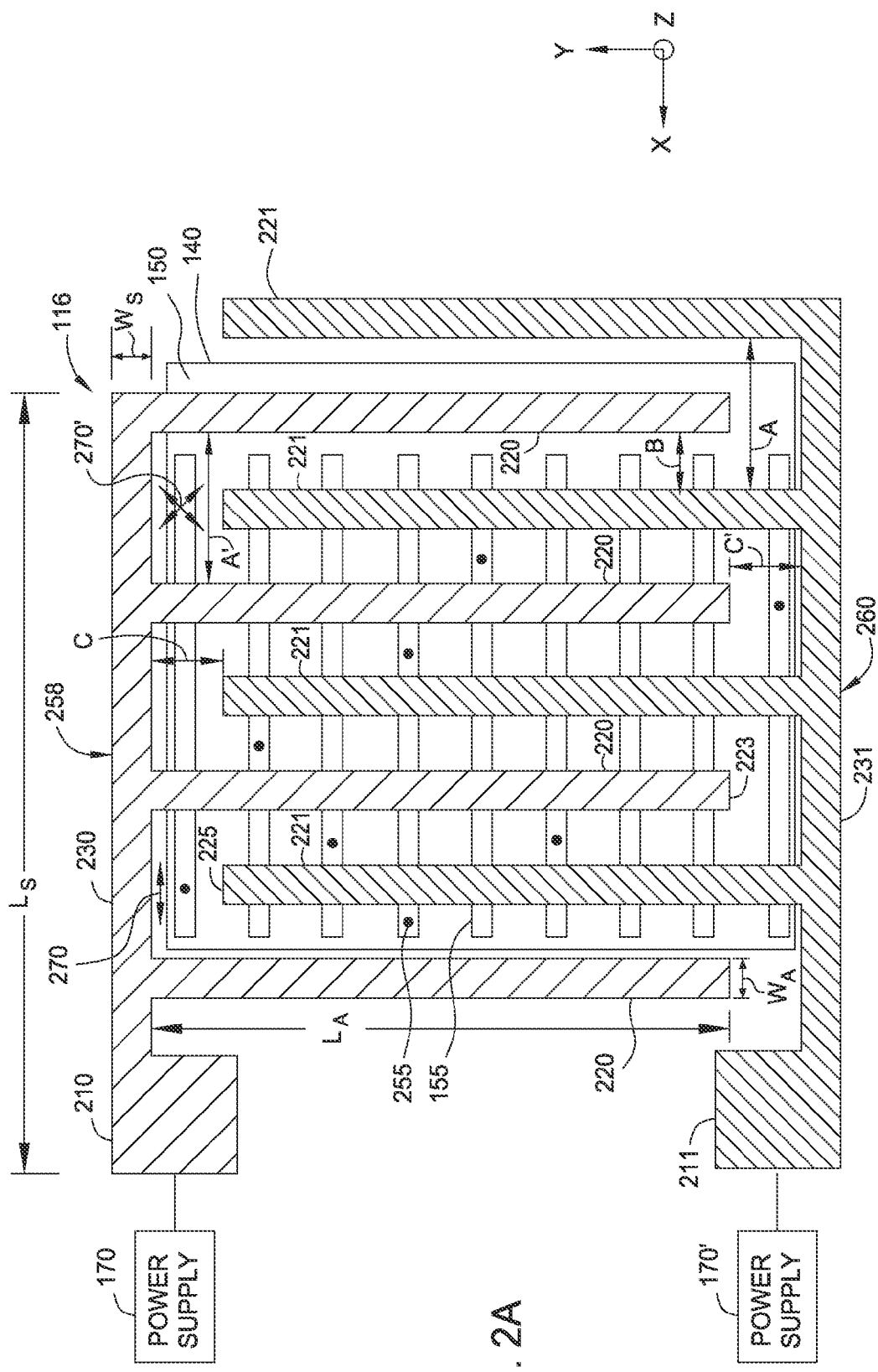
FIG. 2A-2C are top views of embodiments of an electrode assembly of FIG. 1.
Figure 2B:
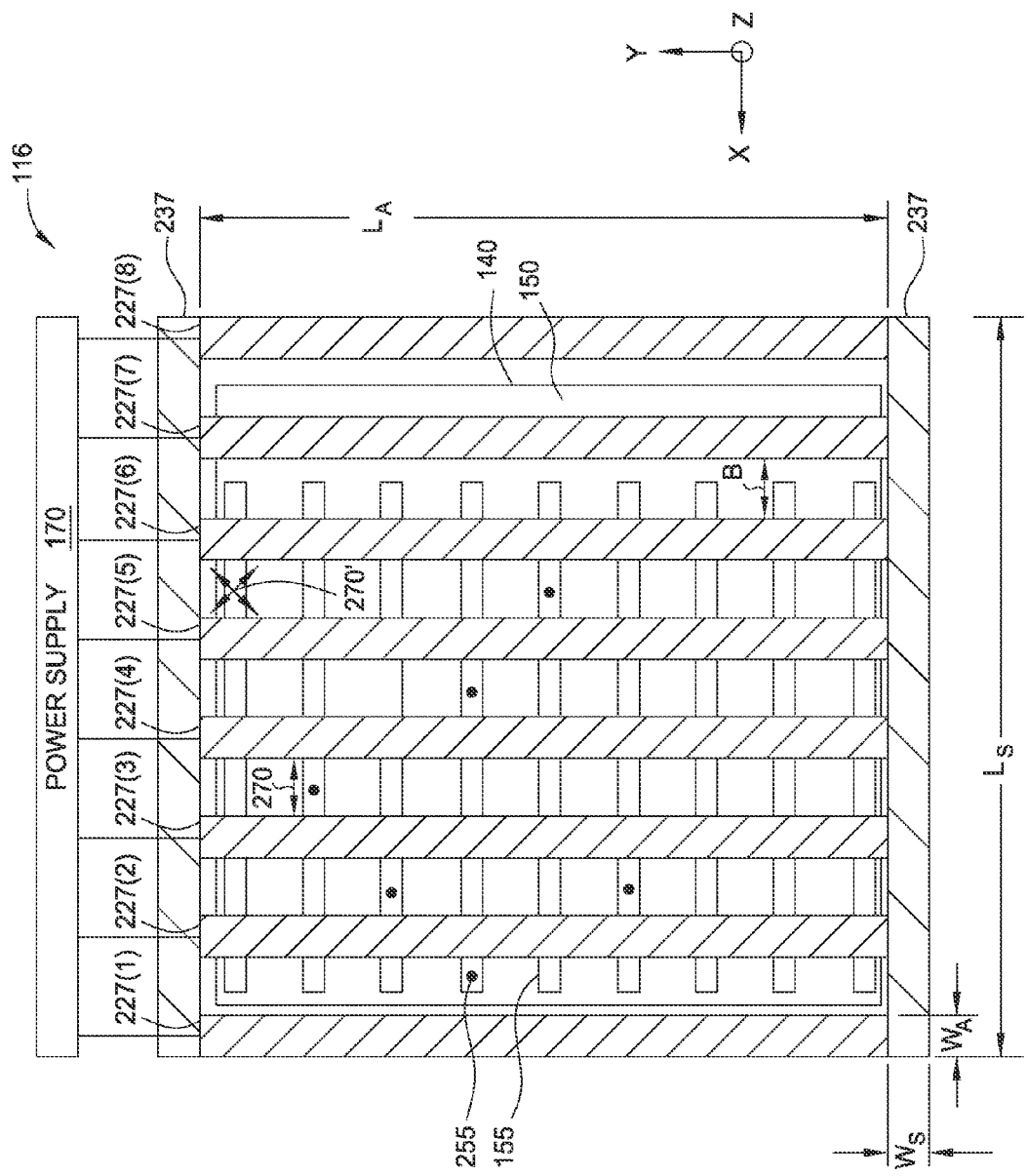
Figure 2C:
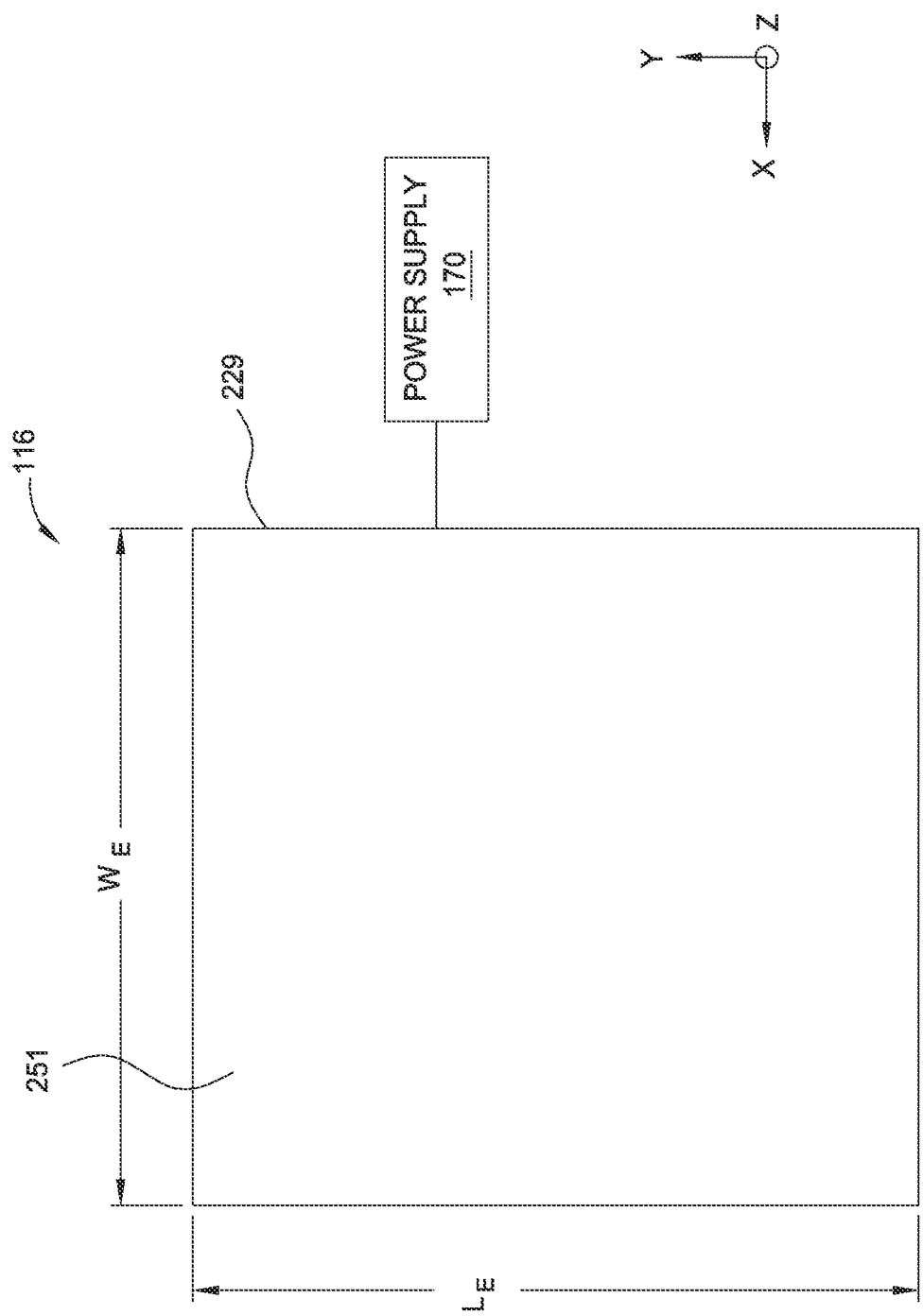

FIG. 2A-2C are top views of embodiments of the electrode assembly 116 of FIG. 1. In the embodiment shown in FIG. 2A, the electrode assembly 116 includes at least a first electrode 258 and a second electrode 260. The first electrode 258 includes a first terminal 210, a support structure 230, and one or more antennas 220. The second electrode 260 includes a second terminal 211, a support structure 231, and one or more antennas 221. The first terminal 210, the support structure 230, and the one or more antennas 220 of the first electrode 258 may form a unitary body. Alternatively, the first electrode 258 may include separate portions that may be coupled together. For example, the one or more antennas 220 may be detachable from the support structure 230. The second electrode 260 may similarly be a unitary body or be comprised of separate detachable components. The first electrode 258 and the second electrode 260 may be prepared by any suitable means. For example, the first electrode 258 and the second electrode 260 may be fabricated by machining, casting, or additive manufacturing.

The support structure 230 may be made from a conductive material, such as metal. For example, the support structure 230 may be made of one or more of silicon, polysilicon, silicon carbide, molybdenum, aluminum, copper, graphite, silver, platinum, gold, palladium, zinc, other materials, or mixtures thereof. The support structure 230 may have any desired dimensions. For example, the length $L_S$ of the support structure 230 may be between about 25 mm and about 450 mm, for example, between about 100 mm and about 300 mm. In some embodiments, the support structure 230 has a length $L_S$ approximately equal to a diameter of a standard semiconductor substrate. In other embodiments, the support structure 230 has a length $L_S$ that is larger or smaller than the diameter of a standard semiconductor substrate. For example, in different representative embodiments, the length $L_S$ of the support structure 230 may be about 25 mm, about 51 mm, about 76 mm, about 100 mm, about 150 mm, about 200 mm, about 300 mm, or about 450 mm. The width $W_S$ of the support structure 230 may be between about 2 mm and about 25 mm. In other embodiments, the width $W_S$ of the support structure 230 is less than about 2 mm or greater than about 25 mm. The thickness of the support structure 230 may be between about 1 mm and about 10 mm, such as between about 2 mm and about 8 mm, such as about 5 mm. In other embodiments the support structure may have a thickness of less than about 1 mm or greater than about 10 mm. In some embodiments, the support structure 230 may have a cross-section that is square, cylindrical, rectangular, oval, rods, or other shapes. Embodiments having round exterior surfaces may avoid arcing.

The support structure 231 may be made of the same materials as the support structure 230. The range of dimensions suitable for the support structure 230 is also suitable for the support structure 231. In some embodiments, the support structure 230 and the support structure 231 are made of the same material. In other embodiments, the support structure 230 and the support structure 231 are made of different materials. The lengths $L_S$, widths $W_S$, and thicknesses of the support structure 230 and the support structure 231 may be the same or different.

The one or more antennas 220 of the first electrode 258 may also be made from a conductive material. The one or more antennas 220 may be made from the same materials as the support structure 230. The one or more antennas 220 of the first electrode 258 may have any desired dimensions. For example, a length $L_A$ of the one or more antennas 220 may be between about 25 mm and about 450 mm, for example, between about 100 mm and about 300 mm. In some embodiments, the support structure 230 has a length $L_A$ approximately equal to the diameter of a standard substrate. In other embodiments, the length $L_A$ of the one or more antennas 220 may be between about 75% and 90% of the diameter of a standard substrate. A width $W_A$ of the one or more antennas 220 may be between about 2 mm and about 25 mm. In other embodiments, the width $W_A$ of the one or more antennas 220 is less than about 2 mm. In other embodiments, the width $W_A$ of the one or more antennas 220 is greater than about 25 mm. The thickness of the one or more antennas 220 may be between about 1 mm and about 10 mm, such as between about 2 mm and about 8 mm. The one or more antennas 220 may have a cross-section that is square, rectangular, oval, circular, cylindrical, or another shape. Embodiments having round exterior surfaces may avoid arcing.

Each of the antennas 220 may have the same dimensions. Alternatively, some of the one or more antennas 220 may have different dimensions than one or more of the other antennas 220. For example, some of the one or more antennas 220 may have different lengths $L_A$ than one or more of the other antennas 220. Each of the one or more antennas 220 may be made of the same material. In other embodiments, some of the antennas 220 may be made of a different material than other antennas 220.

The antennas 221 may be made of the same range of materials as the antennas 220. The range of dimensions suitable for the antennas 220 is also suitable for the antennas 221. In some embodiments, the antennas 220 and the antennas 221 are made of the same material. In other embodiments, the antennas 220 and the antennas 221 are made of different materials. The lengths $L_A$, widths $W_A$, and thicknesses of the antennas 220 and the antennas 221 may be the same or different.

The antennas 220 may include between 1 and about 40 antennas 220. For example, the antennas 220 may include between about 4 and about 40 antennas 220, such as between about 10 and about 20 antennas 220. In other embodiments, the antennas 220 may include more than 40 antennas 220. In some embodiments, each of the antennas 220 may be substantially perpendicular to the support structure 230. For example, in embodiments where the support structure 230 is straight, each antenna 220 may be substantially parallel to the support structure 230. Each of the antennas 220 may be substantially parallel to each of the other antennas 220. Each of the antennas 221 may be similarly positioned with respect to the support structure 231 and each other antenna 221.

Each of the antennas 220 may be substantially parallel to each of the antennas 221. In some embodiments, at least one of the antennas 220 is substantially parallel with at least one of the antennas 221. Each of the antennas 220 may be vertically aligned with each of the antennas 221. In some embodiments, at least one of the antennas 220 is vertically aligned with at least one of the antennas 221.

As shown, the support structure 230 and the support structure 231 are straight. In other embodiments the support structure 230 and the support structure 231 may not be straight. For example, the support structure 230 and the support structure 231 may be curved, jagged, or have other profiles or shapes. In these embodiments, each of the antennas 220 may still be substantially parallel to each of the other antennas 220. In these embodiments, each of the antennas 221 may be substantially parallel to each of the other antennas 221.

Each of the antennas 220 has a terminal end 223. Each of the antennas 221 has a terminal end 225. A distance C is defined between the support structure 230 and the terminal end 225. A distance C' is defined between the support structure 231 and the terminal end 223. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 221 and an adjacent one of the antennas 221. The distance A' is defined between facing surfaces of one antenna 220 and an adjacent one the antennas 220. The distances A and A' may be greater than about 6 mm. For example, the distances A and A' may be between about 6 mm and about 20 mm, such as between about 10 mm and about 15 mm. The distances A and A' between each adjacent antennas 221, 220 may be the same or different. For example, the distances A' between the first and second, second and third, and third and fourth antennas of the one or more antennas 220 may be different. In other embodiments, the distances A' may be the same.

A distance B is defined between facing surfaces of one of the antennas 220 and an adjacent one of the antennas 221. The distance B may be, for example, greater than about 1 mm. For example, the distance B may be between about 2 mm and about 10 mm, such as between about 4 mm and about 6 mm. Each distance B may be the same, each distance B may be different, or some distances B may be the same and some distances B may be different. The strength of an electric field generated between an antenna 220 and an adjacent antenna correlates with the distance B. For example, a smaller distance B correlates with a stronger electric field. Accordingly, in embodiments where a stronger electric field is desired, a smaller distance B may be advantageous.

The antennas 220, 221 may be oriented in an alternating arrangement above the photoresist layer 150. For example, the antennas 220 of the first electrode 258 and the antennas 221 of the second electrode 260 may be positioned such that at least one of the antennas 220 is positioned between two of the antennas 221. Additionally, at least one antenna 221 may be positioned between two of the antennas 220. In some embodiments, all but one of the antennas 220 is positioned between two of the antennas 221. In those embodiments, all but one of the antennas 221 may be positioned between two of the antennas 220. In some embodiments, the antennas 220 and the antennas 221 may each have only one antenna.

In some embodiments, the first electrode 258 has a first terminal 210, and the second electrode 260 has a second terminal 211. The first terminal 210 may be a contact between the first electrode 258 and the power supply 170 or a ground. The second terminal 211 may be a contact between the second electrode 260 and the power supply 170' or a ground. The power supply 170' may be substantially similar to the power supply 170. The first terminal 210 and the second terminal 211 are shown as being at one end of the first electrode 258 and the second electrode 260, respectively. In other embodiments, the first terminal 210 and the second terminal 211 may be positioned at other locations on the first electrode 258 and the second electrode, respectively. The first terminal 210 and the second terminal 211 have different shapes and sizes than the support structure 230 and the support structure 231, respectively. In other embodiments, the first terminal 210 and the second terminal 211 may have generally the same shapes and sizes as the support structure 230 and the support structure 231, respectively.

In operation, the power supply 170 may supply a voltage to the first terminal 210 and/or a power supply 170' may provide a voltage to the second terminal 211. The power 170' may be substantially similar to the power supply 170. The supplied voltage creates an electric field between each antenna of the one or more antennas 220 and each antenna of the one or more antennas 221. The electric field will be strongest between an antenna of the one or more antennas 220 and an adjacent antenna of the one or more antennas 221. The interleaved and aligned spatial relationship of the antennas 220, 221 produces an electric field in a direction parallel to the plane defined by the first surface 134. The substrate 140 is positioned on the first surface 134 such that the latent image lines 155 are parallel to the electric field lines generated by the electrode assembly 116. Since the charged species 255 are charged, the charged species 255 are affected by the electric field. The electric field drives the charged species 255 generated by the photoacid generators in the photoresist layer 150 in the direction of the electric field. By driving the charged species 255 in a direction parallel with the latent image lines 155, line roughness may be reduced. The uniform directional movement is shown by the double headed arrow 270. In contrast, when a voltage is not applied to the first terminal 210 or the second terminal 211, an electric field is not created to drive the charged species 255 in any particular direction. As a result, the charged species 255 may move randomly, as shown by the arrows 270'. In other embodiments, the substrate 140 may be oriented differently relative to the antennas 220, 221. For example, the antennas 220, 221 may be parallel to the latent image lines 155.

FIG. 2B depicts another embodiment of the electrode assembly 116. The electrode assembly 116 includes at least two antennas 227 (indicated as 227(1)-227(8) for ease of discussion), at least one support structure 237, and the power supply 170. The antennas 227 may be made of a material suitable for the antennas 220, 221 described above. The number of antennas 227 may be between 2 and about 80 antennas 227. For example, the number of antennas 227 may be between about 8 and about 80, such as between about 20 and about 40. In other embodiments, the electrode assembly 118 may have more than 80 antennas 227. The antennas 227 may have any cross-sectional shape suitable for the antennas 220, 221 described above. The antennas 227 may have any length $L_A$, width $W_A$, and thickness suitable for the antennas 220, 221. Each of the antennas 227 may have other properties similar to the antennas 220, 221. The antennas 227 may be separated by a distance B. The distance B may be as described above in relation to the antennas 220, 221. In some embodiments, a dielectric material may be positioned between each antenna 227. In some embodiments, each of the antennas 227 may be substantially perpendicular to a support structure 237. Each of the antennas 227 may be substantially parallel to each of the other antennas 227. Each of the antennas 227 may be vertically aligned with each other antenna 227.

Each antenna 227 is coupled on one end to one support structure 237 and on another end to another support structure 237. In other embodiments, a single support structure 237 may enclose a perimeter and each antenna 227 may couple on both ends to the single support structure 237. Each support structure 237 may be comprised of, for example, an insulating or a dielectric material. Each support structure 237 may be coupled to each antenna 227 by, for example, an insulated fastener. Each support structure 237 may have a cross-sectional shape, a length $L_S$, a width $W_S$, and thickness. The cross-sectional shape, length $L_S$, width $W_S$, and thickness may be as described above in relation to the support structures 230, 231.

Each of the antennas 227 may be coupled to a power supply. In the embodiment shown in FIG. 2B, the power supply 170 is independently coupled to each antenna 227. In other embodiments, each antenna 227 may be coupled to an independent power supply. In some embodiments, a first set of antennas 227 may be coupled to a first power supply, and a second set of antennas 227 may be coupled to a second power supply. In one such embodiment, the first set of antennas 227 may include alternating antennas 227 and the second set of antennas 227 may include alternating antennas 227. In some embodiments, the first set and the second set are mutually exclusive sets. For example, the antennas 227(1), 227(3), 227(5), and 227(7) may form a first set and be coupled to one power supply, and the antennas 227(2), 227(4), 227(6), and 227(8) may form a second set and be coupled another power supply. Other embodiments may include additional sets of antennas and additional power supplies. The properties of the power supplied by the power supply 170 or other power supply may be as described above in relation to FIG. 1.

In some embodiments, the power supply 170 may be configured to apply a voltage to one or more antennas 227 while not applying a voltage or applying a different voltage to one or more other antennas 227. In one embodiment, the power supply 170 is configured to apply a potential to one antenna (such as the antenna 227(1)) and a different potential (which may include 0V) to an adjacent antenna (such as the antenna 227(2)). In such an embodiment, an electric field may be generated between the antenna 227(1) and the antenna 227(2) in a direction parallel to the plane formed by the first surface 134. In the embodiment shown in FIG. 2B, the electric field would be created in the direction of the latent image lines 155. In an embodiment where the latent image lines 155 were rotated 90° about the z-axis, the electric field would be in the plane formed by the first surface 134, but perpendicular to the direction of the latent image lines 155.

In some embodiments, the pairs of adjacent antennas 227 that are controlled by the power supply 170 to be at different potentials and the potentials applied to the antennas 227 may vary over time. In one such embodiment, the pairs of adjacent antennas 227 supplied a potential may sequentially vary over time. For example, at a first time, the power supply 170 may provide a different potential to each of the antenna 227(1) and the antenna 227(2). At a second time, the power supply 170 may provide a different potential to each of the antenna 227(2) and the antenna 227(3). At a third time, the power supply 170 may provide a different potential to each of the antenna 227(3) and the antenna 227(4). In other embodiments, the pairs of antennas 227 supplied a voltage over time may vary in a manner other than a sequential manner. By varying over time the potentials of pairs of adjacent antennas 227, the electrode assembly 116 of FIG. 2B may simulate the scanning of an electric field across the first surface 134. For example, the electrode assembly 116 can simulate the scanning of an electric field in the plane of the first surface 134 in the direction of the latent image lines 155, in the plane of the first surface 134 in a direction perpendicular to the latent image lines 155, or in another direction in the plane of the first surface 134. Simulated scanning allows for scanning the substrate 140 using fewer moving parts than actual scanning. In another embodiment, the power supply 170 may provide a first potential to every other antenna 227 and a second potential to each antenna in between. In this manner, the electrode assembly 116 of FIG. 2B can create an electric field similarly to the electrode assembly 116 of FIG. 2A.

FIG. 2C depicts another embodiment of the electrode assembly 116. In the embodiment of FIG. 2C, the electrode assembly 116 includes at least an electrode 229. The electrode 229 is coupled to the power supply 170. In other embodiments, the electrode 229 may be coupled to a ground. The electrode 229 has a top surface 251 opposite the substrate 140. The substrate 140 is positioned below a bottom surface (not shown) of the electrode 229. Both the top surface 251 and the bottom surface of the electrode 229 may be substantially flat. In some embodiments, the top surface 251 or the bottom surface may be convex or concave. The electrode 229 may have a length $L_E$ and a width $W_E$. The length $L_E$ and the width $W_E$ each may be any dimension suitable for the length $L_A$ discussed above regarding the antennas 220, 221. The electrode 229 may have approximately the same lateral dimensions as a standard substrate size or substrate size. For example, in some embodiments, the electrode 229 may have lateral dimensions similar to a 300 mm substrate. In other embodiments, the lateral dimensions of the electrode 229 may be substantially similar to the lateral dimensions of the first surface 134. The electrode 229 may have a maximum thickness of between about 1 mm and about 10 mm, such as between about 2 mm and about 8 mm, such as about 5 mm. In other embodiments, the electrode 229 may have a maximum thickness of less than about 1 mm or greater than about 10 mm. In some embodiments, the electrode 229 may be a sheet electrode. In some embodiments, the electrode 229 may be substantially planar. In some embodiments, the electrode 229 may be continuous or substantially continuous. In operation, the power supply 170 may provide power to the electrode 229, thereby creating an electric field in the z-direction. The properties of the power supplied by the power supply 170 or other power supply may be as described above in relation to the power supply 170 of FIG. 1. By creating an electric field in the z-direction, the electrode assembly 116 may improve the sensitivity to exposure of the photoresist layer 150.

Figure 3A:
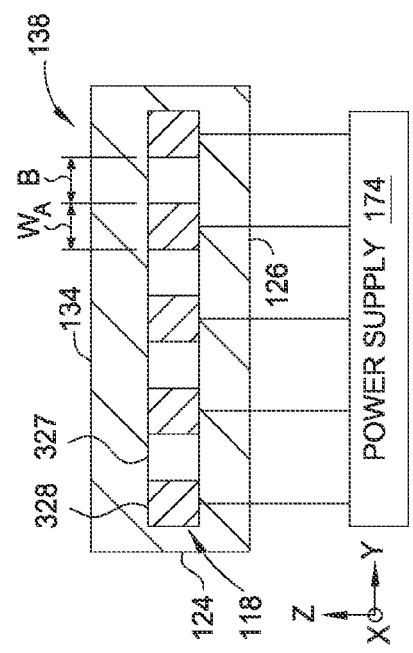
FIGS. 3A and 3B are schematic side cross-sectional views of one embodiment of a substrate support assembly of FIG. 1 having one embodiment of an electrode assembly embedded therein.
Figure 3B:
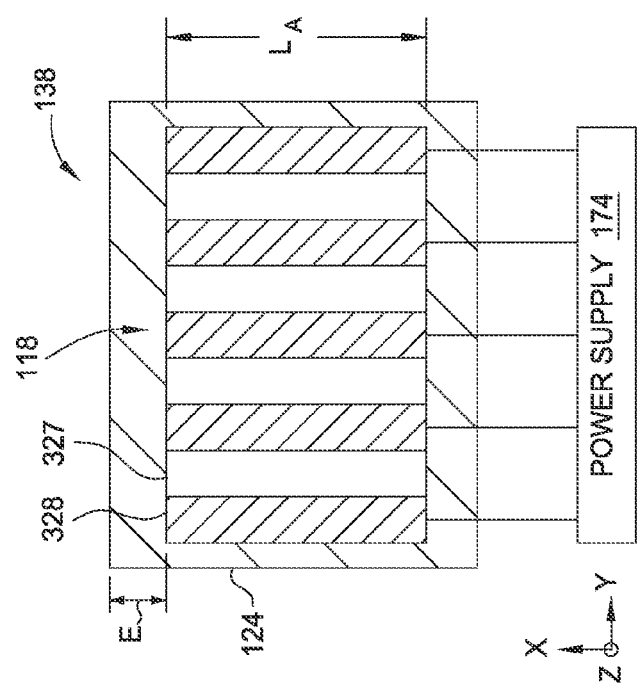

FIGS. 3A and 3B are schematic side cross-sectional views of embodiments of the substrate support assembly 138 of FIG. 1 having one embodiment of the electrode assembly 118 embedded therein. The views of FIGS. 3A and 3B are offset by a 90° rotation about the z-axis. In FIG. 3A, the electrode assembly 118 is embedded between the first surface 134 and the second surface 126 of the body 124. The electrode assembly 118 has a first surface 334 and a second surface 326. The first surface 334 and the second surface 326 are opposite each other and substantially parallel to the first surface 134 of the substrate support assembly. The first surface 334 of the electrode assembly 118 is closer than the second surface 326 to the first surface 134 of the substrate support assembly 138.

The distance D represents the distance separating the first surface 134 of the substrate support assembly 138 from the first surface 334 of the electrode assembly. The distance D may be between about 0.1 mm and about 100 mm. For example, the distance D may be between about 8 mm and about 14 mm. In other embodiments, the distance D is less than about 0.1 mm or greater than about 100 mm. The distance D may control the strength of the electric field provided by the electrode assembly 118 to the first surface 134 and/or the photoresist layer 150. The strength of the electric field controls the rate of diffusion of the charged species 255.

The substrate support assembly 138 has outer side surfaces 348. The electrode assembly 118 has outer side surfaces 347. The distance E represents a rim between the outer side surfaces 347 and the outer side surfaces 348. The distance E may be, for example, any distance suitable for the distance D. The distance E may be constant around the electrode assembly 118, or the distance E may vary. The thickness of the electrode assembly 118 is represented by the distance $T_A$. The distance $T_A$ may be any suitable thickness for the antennas 220, 221 discussed above. As shown, the electrode assembly 118 is coupled to the power supply 174. The properties of the power supplied by the power supply 174 to the electrode assembly 118 may be as described above in relation to the power supply 170 of FIG. 1.

FIG. 3B depicts one version of the embodiment of FIG. 3A rotated 90° about the z-axis of FIG. 1. The electrode assembly 118 illustrated in FIG. 3B includes two or more parallel antennas 328. The antennas 328 may be made of a material suitable for the antennas 220, 221 described above. The number of antennas 328 may as described in relation to the antennas 227 above. The antennas 328 may have a cross-sectional shape suitable for the antennas 220, 221 described above. The antennas 328 have a width $W_A$, and the width $W_A$ may be as described above in relation to the antennas 220, 221. The antennas 328 may be separated by a distance B. The distance B may any suitable distance B described above in relation to the antennas 220, 221. In some embodiments, a spacer 327 may be positioned between some of the antennas 328 or between each antenna 328. The spacer 327 may be made of, for example, a dielectric material. In other embodiments a gas, such as air, or a vacuum may be positioned between some or each antenna 328. In some embodiments, each antenna 328 may be substantially parallel to each other antenna 328. Each antenna 328 may be substantially vertically aligned with each other antenna 328. Other characteristics and properties of the antennas 328 may as described above in relation to the antennas 220, 221. The power supply 174 may control the potential of the antennas 328 in the manner that the power supply 170 controls the potential of the antennas 227 of FIG. 2B.

Figure 3C:
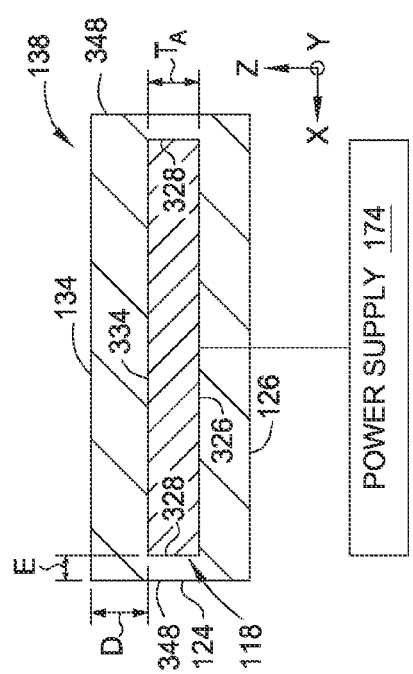
FIG. 3C is a top view of one embodiment of the electrode assembly of FIGS. 3A and 3B.

FIG. 3C is a top view of one embodiment of the electrode assembly 118 of FIGS. 3A and 3B. In this view, the upper portion of the body 124 has been removed for ease of viewing. As shown in FIG. 3C, the spacers 327 and the antennas 328 are surrounded by the body 124. The antennas 328 each have a length $L_A$. Each length $L_A$ may be as described above in relation to the antennas 220, 221.

Figure 4:
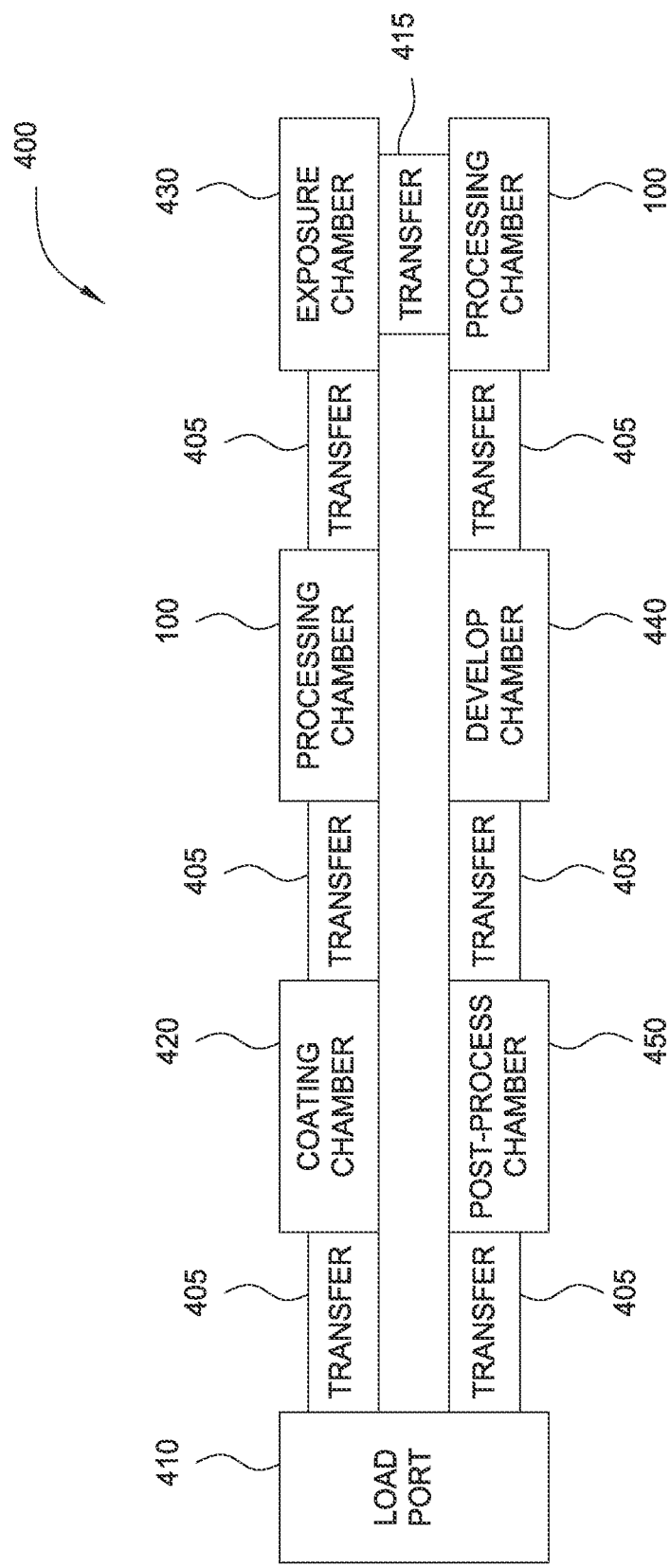
FIG. 4 is a schematic of one representative processing system that may be used to process a substrate according to the embodiments disclosed herein.

FIG. 4 illustrates one representative processing system that may be used to process a substrate according to embodiments disclosed herein. As shown, a processing system 400 includes a load port 410, a coating chamber 420, a processing chamber 100, an exposure chamber 430 (such as a scanner), a second processing chamber 100, a development chamber 440, and a post-process chamber 450. Each chamber of the processing system 400 is coupled to each adjacent chamber by a transfer chamber 405 or a transfer chamber 415. The transfer chambers 405 and the transfer chamber 415 may be substantially similar or different.

The load port 410 may be used to introduce or remove substrates into or out of the processing system 400. The coating chamber 420 may be used, for example, for applying a photoresist to a substrate. The coating chamber 420 may be, for example, a spin coater. The exposure chamber 430 may be used for exposing the substrate to electromagnetic energy in order to form a latent acid image in a photoresist layer on a substrate. The development chamber 440 may be used, for example, for removing portions of the photoresist layer. The post-process chamber 450 may be used, for example, to perform a variety of post-processing steps on a substrate. The processing chamber 100 may be used for a pre-exposure bake, a post-exposure bake, and/or other processing steps. As described above, the processing chamber 100 may include one or more of an electrode assembly 116, an electrode assembly 118, a remote plasma source 160, and magnets 196. However, it is to be understood that the coating chamber 420, the exposure chamber 430, and the development chamber 440 may also be similarly equipped.

Figure 5:
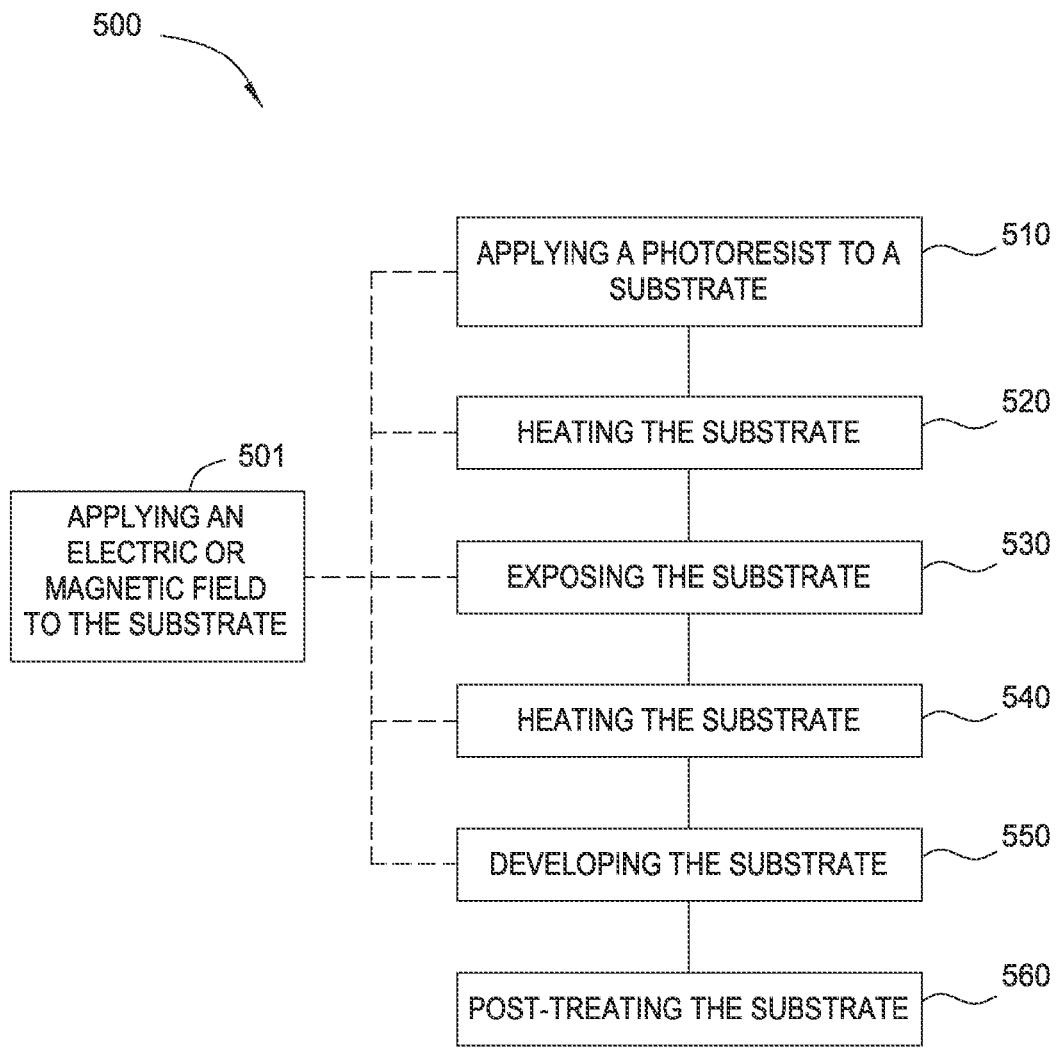
FIG. 5 is a flow diagram of a method of processing a substrate, according to one embodiment.

FIG. 5 is a flow diagram of a representative method 500 of processing a substrate 140. The method 500 for processing the substrate 140 has multiple stages. The stages can be carried out in any order or simultaneously (except where the context excludes that possibility), and the method can include one or more other stages which are carried out before any of the defined stages, between two of the defined stages, or after all the defined stages (except where the context excludes that possibility). Not all embodiments include all the stages.

In general, the method 500 includes a stage 510. The stage 510 includes applying a photoresist containing a photoacid generator to a substrate 140. The method 500 may also include a stage 520. The stage 520 includes heating the substrate 140 in a pre-exposure bake. In general, the method 500 also includes a stage 530. The stage 530 includes exposing the substrate 140 to electromagnetic radiation. The method 500 may further include a stage 540. The stage 540 includes heating the substrate 140 in a post-exposure bake. The method 500 may also include a stage 550 and a stage 560. The stage 550 and the stage 560 include developing the substrate 140 and post-treating the substrate 140, respectively.

The method 500 also includes a stage 501. The stage 501 includes guiding the charged species 255 generated by the photoacid generator in a desired direction, such as a direction parallel to the x-y plane and in the direction of the latent image lines 155, a direction parallel to the x-y plane and perpendicular to the latent image lines 155, a different direction, or combinations thereof. The stage 501 is described herein as occurring during the stage 540. However, the stage 501 may occur during any or any combination of the other stages.

At stage 510, a photoresist is applied to the substrate 140 to form a photoresist layer 150. The photoresist layer 150 may be applied by, for example, by spin coating inside a spin coating apparatus. The substrate 140 may be introduced into and positioned on a rotatable chuck of a spin coater. Thereafter, a solution containing the photoresist may be applied to the substrate 140, and the substrate 140 may rapidly spin, resulting in a uniform photoresist layer 150.

In some embodiments, the spin coater may be part of a processing system, such as the processing system 400. In an embodiment in which the spin coater is part of the processing system 400, the spin coater may be within the coating chamber 420. In such an embodiment, the substrate 140 may enter the processing system 400 through the load port 410 and thereafter be transferred to the coating chamber 420 through a transfer chamber 405.

The photoresist may include a solvent, a photoresist resin, and a photoacid generator. The photoresist resin may be any positive photoresist resin or any negative photoresist resin. Representative photoresist resins include acrylates, Novolac resins, poly(methylmethacrylates), and poly(olefin sulfones). Other photoresist resins may also be used.

Upon exposure to electromagnetic radiation, the photoacid generator generates charged species 255, such as an acid cation and an anion. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryl-diazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

At optional stage 520, the substrate 140 is heated in a pre-exposure bake. During the pre-exposure bake, the substrate is heated to partially evaporate the photoresist solvents. The pre-exposure bake of stage 520 and the photoresist application of stage 510 may occur in the same chamber. For example, both stages may occur in a spin coater. In one embodiment, both stages may occur in the coating chamber 420. Alternatively, the substrate 140 may be transferred to a different processing chamber. For example, in an embodiment using the processing system 400, the substrate 140 may be transferred from the coating chamber 420 to a processing chamber 100 through a transfer chamber 405.

At stage 530, the substrate 140 and portions of the photoresist layer 150 are exposed to electromagnetic radiation. In one embodiment, after the completion of stage 520, the substrate 140 is transferred from the processing chamber 100 to the exposure chamber 430 through the transfer chamber 405.

In stage 530, portions of the photoresist layer 150 are selectively exposed and portions of the photoresist layer 150 are selectively unexposed. Portions of the photoresist layer 150 exposed to electromagnetic radiation may have different chemical properties than the portions of the photoresist layer 150 not exposed to the electromagnetic radiation. The charged species 255 generated by the photoacid generator results in a latent acid image in the resist resin. In some embodiments, a photomask or reticle may be positioned between the photoresist layer 150, and the photoresist layer 150 may be exposed to electromagnetic radiation through the mask or reticle. The mask or reticle may be configured to transfer a pattern containing lines to the photoresist layer 150. In other embodiments, a pattern containing lines may be transferred to the photoresist layer 150 using maskless lithography techniques. The transferred latent image lines 155 may have any desired length, width, and spacing between latent image lines 155. For example, in some embodiments, the line widths and line spacings may be between about 10 nm and about 16 nm. In other embodiments the line widths and spacings may be less than about 10 nm or greater than about 16 nm. In some embodiments, the length of the latent image line 155 is about 150% of the width of the latent image line 155. In other embodiments, the length of the latent image line 155 is greater than about 200% of the width of the latent image line 155, such as for example, greater than about 1000% of the width of the latent image line 155.

The electromagnetic radiation generally has a wavelength suitable for exposing the photoresist layer 150. For example, the electromagnetic radiation may have a wavelength in the extreme ultra violet (EUV) range, such as between about 10 nm and about 124 nm. In other embodiments, the electromagnetic radiation may be generated by an argon fluoride laser. In such an embodiment, the electromagnetic radiation may have a wavelength of about 193 nm. In some embodiments, the wavelength may be 248 nm. Other embodiments may use different wavelengths. In some embodiments, the electromagnetic radiation is from an electron beam or an ion beam.

At stage 540, the substrate 140 is heated in a post-exposure bake process. In one embodiment, after the completion of stage 530, the substrate 140 is transferred to a processing chamber. In some embodiments, the processing chamber may be the processing chamber 100. In embodiments using the processing system 400, the substrate 140 may be transferred from the exposure chamber 430 to the processing chamber 100 through the transfer chamber 415. The substrate 140 may be positioned on the first surface 134 of the substrate support assembly 138. The power supply 174 may provide power to the embedded heater 132 to heat the substrate 140. The embedded heater 132 may quickly heat the substrate 140 and the photoresist layer 150. For example, the embedded heater 132 may raise the temperature of the photoresist layer 150 from ambient temperature to between about 70° C. and about 160° C., such as between about 90° C. and 140° C., in less than about 2 seconds. The temperature of the substrate 140 and the photoresist layer 150 may be maintained at between about 70° C. and about 160° C., such as between about 90° C. and 140° C., during stage 540. In other embodiments, the substrate 140 may be heated by a resistive heater, a heat lamp, a laser, or other heat source. In still other embodiments, the substrate 140 may be heated by more than one of the embedded heater 132, the resistive heater, the heat lamp, the laser, and the other heat sources. In some embodiments, the power supply 170 may also heat the substrate 140.

In embodiments including an electrode assembly 116, the heat lamp, laser, or other heat source may also heat one or more of the antennas 220, 221, 227, and/or the electrode 229. The heat sources may heat the antennas and/or electrodes to between about 70° C. and about 160° C., such as between about 90° C. and 140° C., during stage 540. In some embodiments, the temperatures of at least some of the antennas 220, at least some of the antennas 221, at least some of the antennas 227, and/or the electrode 229 are controlled to substantially match the temperature of the substrate support assembly 138, such as, for example, the first surface 134. Matching the temperature allows for more uniform control of the temperature of the photoresist layer 150 during stage 540. During the post-exposure bake, photoacid generators in the photoresist layer 150 may continue to alter the chemical properties of the exposed portions of the photoresist layer 150.

Optionally during stage 540, the pressure of the processing chamber 100 may be reduced by a vacuum source. The processing volume 112 may be reduced, for example, by the vacuum pump coupled to the processing volume 112 through the pumping port 114. In some embodiments, the pressure of the processing chamber 100 may be reduced to at least $10^{-5}$ Torr. For example, the pressure may be reduced to between about $10^{-6}$ Torr and about $10^{-8}$ Torr. Reducing the pressure may reduce or eliminate arcing during processing. In some embodiments, the pressure of the processing chamber 100 is not reduced. By not reducing the pressure, heat from the heat sources may be more readily transferred to the substrate 140.

In some embodiments, the pressure in the processing volume 112 is reduced to a pressure between ambient pressure and $10^{-5}$ Torr.

As discussed above, stage 501 may occur during stage 540 (or during any other stage). In stage 501, the charged species 255 may be guided in a desired direction by at least one of an electric field, a magnetic field, and a plasma. An electric field may be generated by, for example, the electrode assembly 116 and/or the electrode assembly 118. The magnetic field may be generated by, for example, the magnets 196. The plasma may be generated by, for example, the remote plasma source 160.

In some embodiments including an electrode assembly 116, the electrode assembly 116 and the photoresist layer 150 remain stationary with respect to each other while the electrode assembly 116 generates an electric field. In other embodiments, the electrode assembly 116 and the photoresist layer 150 move relative to each other while the electrode assembly 116 generates an electric field. Relative motion may, for example, allow the electric field to scan the surface of the substrate 140. Relative motion between the first surface 134 and/or a substrate 140 positioned thereon may be performed as described above in relation to FIG. 1. Scanning the surface of the substrate 140 with an electric field may allow for higher throughput and more precise control of the application of the electric field to the substrate 140. Scanning also allows for the application of a more uniform electric field to the substrate 140, which allows for a more uniform line edge roughness reduction. In some embodiments, such as those using the electrode assembly 116 of FIG. 2B and/or the electrode assembly 118 of FIGS. 3A-3C, the electric field may scan the surface of the substrate 140 without relative motion between the electrode assembly 116 and the substrate 140. Simulated scanning offers the advantage of having fewer moving parts and/or fewer overall parts in the processing chamber 100.

In some embodiments including relative motion between the electrode assembly 116 and the photoresist layer 150, the distance d varies over time. Varying d during scanning alters the electric field strength, thus creating different photoresist layer 150 profiles at different locations. In other embodiments including relative motion disclosed herein, the substrate support assembly 138 rotates relative to the electrode assembly 116. For example, the substrate support assembly 138 may rotate about the z-axis. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time. In other embodiments, the electrode assembly 116 rotates relative to the substrate support assembly 138. The electrode assembly 116 may rotate in the same manner as the substrate support assembly 138.

The electric field generated by the electrode assembly 116 and/or the electrode assembly 118 may have a field strength of, for example, between about 0.1 MV/m and about 100 MV/m, such as, between about 0.5 MV/m and about 10 MV/m. The electric field may be generated by one or more power supplies. In some embodiments, the one or more power supplies may include the power supply 170 and/or the power supply 174. The power provided by the one or more power supplies may have the properties discussed above in relation to FIG. 1. The above power conditions may allow for the charged species 255 to diffuse in the desired direction on the order of between about 10 nm and about 50 nm while limiting the diffusion in an undesired direction to less than about 5 nm. For example, in some embodiments, the diffusion in the direction of the latent image lines 155 may be on the order of between about 10 nm and about 50 nm while the diffusion in the x-y plane but perpendicular to the lines is limited to less than about 5 nm. In some embodiments, the diffusion in the direction of the latent image lines 155 may be less than about 10 nm or greater than about 50 nm while the perpendicular diffusion is about 5 nm. In some embodiments, the pulsed DC power conditions allow for the electric field to act on the charged species 255 long enough to move the charged species 255 between about 10 nm and about 50 nm before switching the polarity. In other embodiments, the charged species may move less than about 10 nm or more than about 50 nm before switching polarity. In some embodiments, the power conditions provide a ratio of diffusion substantially along the desired direction to diffusion along an undesired direction of greater than about 5:1. For example, the ratio may be greater than about 10:1, such as greater than about 20:1. In some embodiments the ratio is between about 5:1 and about 20:1. In other embodiments, the ratio is between about 10:1 and about 20:1.

The power supply 170 and/or the power supply 174 may continue to apply a voltage to the electrode assembly 116 and/or the electrode assembly 118 for a period of time. For example, the power supply may continue to supply the voltage for between about 30 seconds and about 180 seconds, such as between about 45 seconds and about 90 seconds, such as about 60 seconds. In other embodiments, the voltage may be applied for fewer than 30 seconds or more than 180 seconds. The length of time that the voltage is applied may depend on the photoresist layer 150 dimensions, the electrode assembly 116, the electrode assembly 118, the amount of photoacid generator incorporated into the photoresist layer 150, the electric field strength, and other variables.

The strength of the electric field applied to the photoresist layer 150 can be modified by varying several variables. For example, the electric field strength can be modified by the amount of voltage applied to the electrode assembly 116, the electrode assembly 118, and/or the substrate support assembly 138. In some embodiments, the electric field strength may also be controlled by varying the distances d between the electrode assembly 116 and the photoresist layer 150. The distance d may be adjusted by at least one of the actuator 190 and the lift system coupled to the substrate support assembly 138. In some embodiments, the distance d may be greater than about 0.1 mm. For example, the distance d may be between about 0.1 mm and about 100 mm. For example, the distance d may be between about 8 mm and about 14 mm. In other embodiments, the distance d is less than about 0.1 mm or greater than about 100 mm. A smaller distance d applies a stronger electric field to the charged species 255. In some embodiments, the electric field strength may be controlled by varying the distance D between the surface 334 of the electrode assembly 118 and the first surface 134 of the substrate support assembly 138. The electric field strength supplied by the electrode assembly 116 may be modified by modifying the dimensions of the electrode assembly 116. For example, the dimensions A, B, and C may affect the strength of the electric field at the photoresist layer 150. The electric field strength supplied by the electrode assembly 118 may be modified by adjusting the dimension B. For example, a smaller distance B correlates with a stronger electric field. Accordingly, in embodiments where a stronger electric field is desired, a smaller distance B may be advantageous.

In some embodiments, a magnetic field is generated in order to guide the charged species 255 in the desired direction. The magnetic field strength at the photoresist layer 150 may be between about 0.1 Tesla (T) and about 10 T, such as between about 1 T and about 5 T. In embodiments including a magnetic field, the magnets 196 may remain stationary or move relative to the photoresist layer 150 and the substrate 140. In some embodiments, the electrode assembly 116 generates and electric field and the magnets 196 generate a magnetic field.

In some embodiments, a plasma is flowed into the processing volume 112 in order to guide the charged species 255. The plasma may be flowed into the processing volume 112 from the remote plasma source 160. The remote plasma may be generated as described above in relation to FIG. 1. Electrons present in the plasma may guide the charged species 255 in the latent image lines 155 in the z-direction away from the substrate support assembly.

In some embodiments, the charged species 255 are guided in a direction substantially perpendicular to the plane formed by the first surface 134 of the substrate support assembly 138. In one such embodiment, the substrate 140 is positioned opposite an electrode assembly, such as the electrode assembly 116 depicted in FIG. 2C. An electric field is generated in a perpendicular direction by applying a potential to at least one of the substrate support assembly 138 (with, for example, the power supply 174) and the electrode assembly 116 (with, for example, the power supply 170). The power applied by the power supply 170 and/or the power supply 174 may be as described above. Additionally or alternatively, the charged species 255 may be guided in the perpendicular direction by a plasma generated by the remote plasma source 160 and the power supply 176. Optionally, the charged species 255 may be guided in the perpendicular direction by a magnetic field generated by the magnets 196 and in the direction parallel to any generated electric field. When a plasma is used to guide the charged species 255, the magnetic field may be oriented to guide the charged species in the perpendicular direction. Guiding the charged species 255 in the perpendicular direction has the benefit of increasing resist sensitivity. For example, in an embodiment using an EUV radiation source in the exposure stage 530, the photoresist layer 150 can be exposed to the desired extent using fewer overall photons than in an embodiment not guiding the charged species in the perpendicular direction.

In some embodiments, the charged species 255 are simultaneously guided in a direction substantially perpendicular to the plane formed by the first surface 134 of the substrate support assembly 138 and along the direction of the latent image lines 155 in the plane formed by the first surface 134. In such an embodiment, the charged species may be guided perpendicularly by an electric field and/or a plasma as discussed above. However, the magnets 196 may generate a magnetic field in the plane of the first surface 134 and perpendicular to the direction of the latent image lines 155. The generated magnetic field may have the properties described above. Guiding the charged species 255 in this manner has the advantage of increasing the sensitivity of the resist to exposure while simultaneously decreasing line edge/width roughness.

In some embodiments, the charged species 255 are guided along the direction of the latent image lines 155 in the plane formed by the first surface 134. In such embodiments, an electric field may be generated by the electrode assembly 116 of either FIG. 2A or FIG. 2B or the electrode assembly of FIGS. 3A-3C. In such embodiments, a power may be supplied to one of the electrodes of FIG. 2A, FIG. 2B, or FIGS. 3A-3C and/or the substrate support assembly 138 by one or more power supplies, such as, for example, any combination of the power supply 170, 174, and other power supplies. The properties of the delivered power may be as described above.

Optionally, the magnets 196 may generate a magnetic field in a direction perpendicular to the electric field. Guiding the charged species 255 in this manner has the advantage of decreasing line edge/width roughness.

As noted above, the charged species 255 may be guided in any stage or in any combination of changes. In some embodiments, the charged species 255 are guided in one direction relative to the latent image lines 155 in one stage and guided in another direction relative to the latent image lines 155 in another stage. For example, during the exposure stage 530, the charged species 255 may be guided in a direction perpendicular to the first surface 134, and during the post-exposure bake stage 540, the charged species 255 may be guided in the direction of the latent image lines 155 or both in the direction of the latent image lines 155 and in a direction perpendicular to the first surface 134. In another embodiment, the charged species may be guided in the direction of the latent image lines 155 or both in the direction of the latent image lines 155 and in a direction perpendicular to the first surface 134 during the exposure stage 530 and guided in a direction perpendicular to the first surface 134 during the post-exposure bake. In some embodiments, the charged species 255 may be guided in different directions within a single phase. For example, in an exposure stage or during a post-exposure bake stage, the charged species 255 may be guided in a direction perpendicular to the first surface 134 for a portion of the stage and guided in a direction perpendicular to the first surface 134 and in a direction along the direction of the latent image lines for a portion of the stage. Such a variation in guided direction may be achieved by toggling the magnetic field on and off while applying a vertical magnetic field.

At optional stage 550, the photoresist is developed. In one embodiment, after the completion of stage 540, the substrate 140 is transferred to a development chamber. In embodiments using the processing system 400, the substrate 140 may be transferred from the processing chamber 100 to the development chamber 440 through the transfer chamber 405. The development chamber 440 may also include an electrode assembly 116 coupled to one or more power supplies and/or an actuator 190 and magnets 196. The substrate 140 may be positioned in the development chamber 440 relative to the electrode assembly 116 and magnets 196 as described in relation to the coating chamber 420

At stage 550, the photoresist layer 150 may be developed by, for example, exposing the photoresist layer 150 to a developer, such as a sodium hydroxide solution, a tetramethylammonium hydroxide solution, xylene, or Stoddard solvent. The substrate 140 may be rinsed with, for example, water or n-butylacetate. By stage 550, the latent image lines 155 may no longer be latent. The lines 155 on the substrate 140 will have less line edge/width roughness compared to conventional techniques.

At optional stage 560, additional post-processing steps may be performed. The additional post-processing steps may be performed, for example, in a post-processing chamber. In an embodiment using the processing system 400, the substrate 140 may be transferred from the development chamber 440 through the transfer chamber 405 to the post-process chamber 450 for post-processing. For example, after rinsing, the substrate 140 may be hard baked and inspected. After inspection, an etching process may be performed on the substrate 140. The etching process uses the features of photoresist layer 150, such as the lines 155, to transfer a pattern to the layer 145.

The previously described embodiments have many advantages, including the following. For example, the embodiments disclosed herein may reduce or eliminate line edge/width roughness. Additionally, the embodiments disclosed herein may allow for new fabrication process flows. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
applying a photoresist layer containing a photoacid generator to a substrate;
exposing portions of the photoresist layer to electromagnetic radiation to generate charged species from the photoacid generator and to form substantially parallel lines of material in the photoresist layer having different chemical properties than the portions of the photoresist layer not exposed to the electromagnetic radiation;
after exposing the substrate, heating the substrate within a vacuum processing chamber and reducing the pressure; and
guiding the generated charged species in a direction substantially perpendicular to the substrate supporting surface.

2. The method of claim 1, wherein the guiding comprises flowing a remotely generated plasma into the vacuum processing chamber.

3. The method of claim 2, wherein an energy of the ions in the remotely generated plasma is between about 5 eV and about 50 eV.

4. The method of claim 2, further comprising exposing the photoresist layer to a magnetic field, wherein the magnetic field is oriented to guide the charged species in a direction substantially perpendicular to the substrate supporting surface.

5. The method of claim 1, wherein the generated charged species are guided by an electric field generated by applying to a voltage to a substantially continuous electrode having a flat surface opposite the photoresist layer, wherein the electrode is spaced apart from the substrate support by a distance of at least one 0.1 mm, wherein the voltage is between about 500V and 100 kV and is applied from a pulsed DC power source, wherein the power has a frequency of between about 10 Hz and 1 MHz.

6. The method of claim 5, wherein the duty cycle of the pulsed DC power is between about 5% and about 95%, and wherein the rise and fall time of the pulsed DC power is between about 1 ns about 1000 ns.

7. The method of claim 5, further comprising exposing the photoresist layer to a magnetic field, wherein the magnetic field is oriented in a direction parallel to the electric field.

8. The method of claim 7, wherein the magnetic field strength at the photoresist layer is between about 0.1 T and about 10 T.

9. The method of claim 4, further comprising controlling the temperature of the electrode to substantially match the temperature of the substrate.

10. The method of claim 4, further comprising guiding the generated charged species in a direction substantially parallel to the substrate supporting surface and along the direction of the substantially parallel lines.

11. The method of claim 10, wherein the guiding the generated charged species in a direction substantially perpendicular to the substrate supporting surface and the guiding the generated charged species in a direction substantially parallel to the substrate supporting surface and along the direction of the substantially parallel lines occur at the same time.

12. The method of claim 10, wherein the guiding the generated charged species in a direction substantially perpendicular to the substrate supporting surface occurs during the exposing and the guiding the generated charged species in a direction substantially parallel to the substrate supporting surface and along the direction of the substantially parallel lines occurs during the heating.

13. The method of claim 10, wherein the guiding the generated charged species in a direction substantially perpendicular to the substrate supporting surface occurs during the heating and the guiding the generated charged species in a direction substantially parallel to the substrate supporting surface and along the direction of the substantially parallel lines occurs during the exposing.

* * * * *